United States Patent [19]
Holub et al.

[11] 3,990,833
[45] Nov. 9, 1976

[54] SWITCHING DEVICES FOR PHOTOFLASH UNIT

[75] Inventors: Fred F. Holub, Schenectady; Nicholas Roman, Ballston Lake; Harold F. Webster, Scotia, all of N.Y.

[73] Assignee: General Electric Company, Schenectady, N.Y.

[22] Filed: Sept. 29, 1975

[21] Appl. No.: 617,522

Related U.S. Application Data

[63] Continuation-in-part of Ser. No. 460,801, April 15, 1974, abandoned.

[52] U.S. Cl. .............................. 431/95 A; 240/1.3; 252/506; 252/510; 252/514; 252/518; 337/416
[51] Int. Cl.² .................... F21K 5/02; H01B 1/02
[58] Field of Search ........... 431/95, 95 A; 252/501, 252/506, 510, 514, 518; 337/401, 413, 416; 240/1.3

[56] References Cited
UNITED STATES PATENTS

| 3,297,846 | 1/1967 | Peltier | 337/416 |
| 3,451,813 | 6/1969 | Kinney et al. | 96/36.2 |
| 3,458,270 | 7/1969 | Ganser et al. | 431/95 |
| 3,459,488 | 8/1969 | Schroder et al. | 431/95 |
| 3,573,230 | 3/1971 | Van Voorhees | 252/514 |

Primary Examiner—Carroll B. Dority, Jr.
Attorney, Agent, or Firm—John F. McDevitt; Lawrence R. Kempton; Frank L. Neuhauser

[57] ABSTRACT

A photoflash unit is designed to have a plurality of lamps fired individually and in sequence and includes a plurality of switching devices capable of being easily activated by radiant energy generated during flashing of the lamps. Initially, the switches have a high resistance ("off" condition) and after being activated by radiation, they undergo a chemical change to a conductive state ("on" condition). The switches are prepared from compositions which impart improved shelf life to the switches under conditions of high relative humidity.

22 Claims, 4 Drawing Figures

SWITCHING DEVICES FOR PHOTOFLASH UNIT

BACKGROUND OF THE INVENTION

This application is a continuation-in-part of Application Ser. No. 460,801, filed Apr. 15, 1974, which is now abandoned, and assigned to the assignee of the present invention.

The invention relates to multiple photoflash lamp units designed for taking a number of flashlight photographs within a short period of time.

Various designs and constructions have been proposed for multiple flash units. By mounting several flashbulbs in a unitary package, manual replacing of individual burnt-out bulbs is avoided. An illustration of such a unit is the flashcube designed to be attached directly to the camera and which may or may not require the use of a battery. The flashcube contains four small flashbulbs each with its own reflector, and the entire unit is encased is a plastic shield. As the bulb is flashed and the picture is taken, the cube automatically rotates to the next bulb and places the electrical contacts connecting that bulb into position to permit subsequent flashing. Another illustration is the flash array which consists of a nonrotating planar or linear array of photoflash lamps having the bulbs and reflectors mounted linearly as described by J. B. Harnden et al, U.S. Pat. No. 3,598,985. Such multiple flash units must be able to flash the lamps individually. Thus, flashcubes contain mechanical devices which move a pair of electrical contacts connected to a single lamp into position. An electronic flashing circuit has been used in the flash array in which the switching between individual lamps is accomplished electronically in a unit located outside of the array.

Another switching device for a flash array is proposed by H. G. Ganser et al, U.S. Pat. No. 3,458,270 which discloses a series of flash units employing several flashlight lamps to be fired successively. In this unit, part of the thermal energy developed in firing the flashlight lamp actuates a switch for making the next flashlight lamp ready for operation. One type of switch disclosed consists of a mass of silver oxide together with a polyvinyl resin binder. Upon exposure to radiant heat, a chemical reaction occurs in which the silver oxide is converted to metallic silver. Unfortunately, such a switch based entirely on silver oxide is commercially unsatisfactory. It is unstable under conditions of elevated temperature and high humidity and consequently has a limited shelf life.

SUMMARY OF THE INVENTION

It is, therefore, an object of the present invention to provide an improved, disposable photoflash lamp unit having switches which are stable under conditions of high temperature and high humidity.

In accordance with the present invention, we have provided a photoflash lamp unit which includes a plurality of flash lamps, a circuit board with an electrical circuit into which said lamps are arranged to fire individually and in sequence, and a plurality of solid state radiant energy switching devices as a part of the electrical circuit. Each device is located adjacent one of the lamps to receive radiant energy emitted by the lamp, the device being a mass of a composition preferably comprising silver oxide, a carbon-containing silver salt and a humidity resistant organic polymer binder. The switch initially has a relatively high resistance ("off" condition) and, after undergoing a thermochemical change as a result of the thermal energy emitted by the lamp, the silver oxide and the silver salt are converted to metallic silver which has a relatively low electrical resistance (on condition).

We have discovered that if silver oxide alone is used as the silver source, the switch is too sensitive and acts too vigorously upon converting. That is, the silver oxide may convert when exposed to heat or light other than emitted form the flashing lamp and may convert so vigorously as to damage the circuit board or the electrical circuit. If a carbon-containing silver salt alone is used as the silver source, the switch may not be sufficiently sensitive to convert reliably when exposed to the thermal energy of the lamp. But, by forming the switch out of a mixture of silver oxide and a carbon-containing silver salt, the sensitivity and vigorous conversion action exhibited by silver oxide are reduced and yet the switch is still sufficiently sensitive to convert reliably when the adjacent lamp is flashed.

BRIEF DESCRIPTION OF THE DRAWINGS

The invention is more clearly understood from the following description taken in conjunction with the accompanying drawing in which.

DESCRIPTION OF THE PREFERRED EMBODIMENTS

Figure 1:
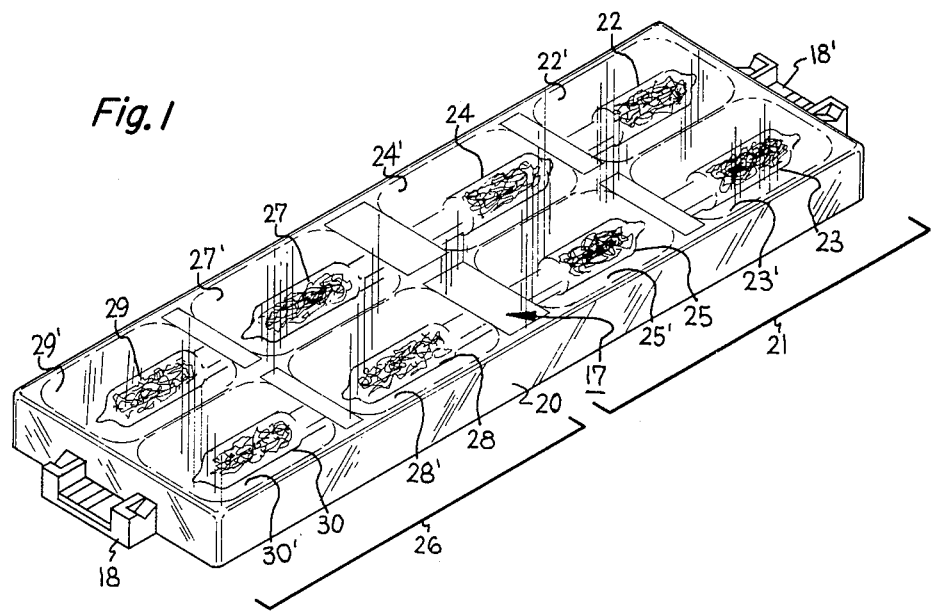
FIG. 1 is a perspective view of a multiple photoflash unit according to the present invention.

Referring now to the drawing, in the embodiment illustrated by FIG. 1, a multiple flash lamp unit 17 shown as being of the planar array type and containing a plurality of electrically fired flashlamps is provided with a plug-in connector tab 18 at the lower side or end thereof adapted to fit directly into a camera. The lamp array 17 is also provided with a second plug-in connector tab 18' at the top side or end thereof whereby the array 17 is adapted to be attached to the camera in either of two orientations, i.e. with either the tab 18 or 18' plugged into the camera. The array 17 is provided with an upper group 21 of flashlamps 22, 23, 24 and 25 and a lower group 26 of flashlamps 27, 28, 29 and 20. Reflectors 22'–25' and 27'–30' are disposed behind the respective flashlamps so that as each lamp is flashed, its light is projected forwardly of the array 17. The relationship of each reflector to its associated lamp and a suitable plastic housing 20 together with a transparent front cover may be generally that as disclosed in Weber, U.S. application Ser. No. 448,671, filed Mar. 6, 1974, now U.S. Pat. No. 3,937,946, and assigned to the same assignee as the present invention.

Figure 2:
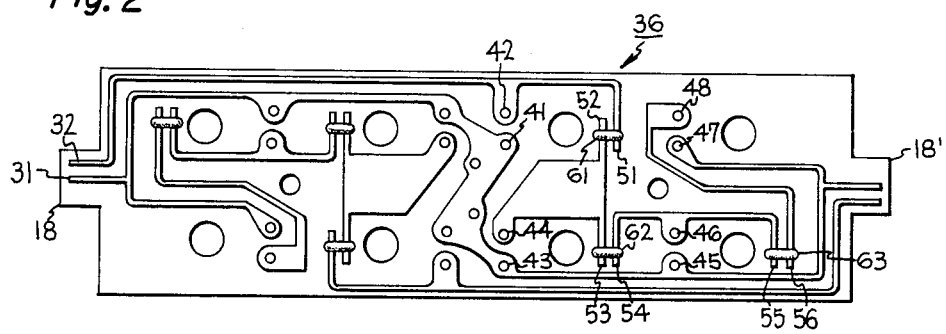
FIG. 2 is a top view of a circuit board showing the electrical circuitry of a multiple flash lamp unit as illustrated by FIG. 1 and incorporating the switching devices.

FIG. 2 shows a circuit board 36 which is contained within the housing 20 behind the reflectors 22', etc., which supports the flash lamps by their lead-in wires (see FIG. 3) and which contains circuitry providing for sequential firing of the lamps of each group of lamps. The plug-in connector tabs 18 and 18' may be formed integrally with the circuit board 36 on opposite ends thereof as shown. While an entire illustrative printed circuit is shown, only the portion of the printed circuit servicing the upper group 21 will be discussed in detail since the portion of the printed circuit servicing the lower group 26 is depicted as essentially the mirror image thereof. The circuit board 36 is considered from the point of view of being plugged into the camera (not shown) through connector tab 18 whereby the circuit board terminals 31 and 32 make electrical contact with circuitry located within the camera. The circuit board terminal 31 is part of a continuous conductor on the board which is connected to one electrical lead wire of all of the flashlamps and for purposes of this description to the four flashlamps 22, 23, 24 and 25 at points 41, 43, 45 and 47 by suitable means such as soldering, welding or crimping. The second terminal 32 is part of a conductor run that is connected to the second lead wire of lamp 24 at point 42 and terminates at radiation switch terminal 51 which is close to, but spaced apart from, radiation switch terminal 52. Similar switch terminal pairs are located at 53–54 and 55–56. The second lead wires of lamps 25, 23 and 22 are attached at points 44, 46 and 48, respectively. Radiation switches 61, 62 and 63 are respectively positioned to be in contact with and to bridge across the respective pairs of switch terminals at 51–52, 53–54, and 55–56. Initially all the switches are in the off condition which permits only the first bulb 24 in the sequence to be fired. The firing of any flashbulb turns the switch adjacent thereto to the on condition.

Figure 3:
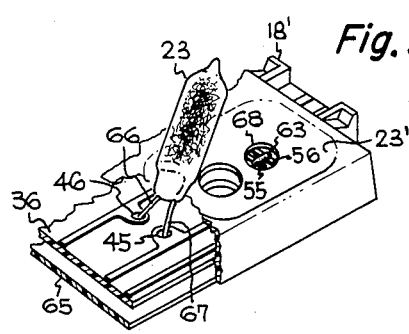
FIG. 3 is a three-dimensional broken-away view showing a single flash lamp in a slightly raised position and also showing the relationship between the lamp and the switch.

FIG. 3 illustrates a single flash lamp 23 in a slightly raised position with the transparent cover removed to show the relative position between the lamp 23 and the switch 63 adjacent thereto below reflector 23'. The flash lamp 23 is attached to and supported by the printed circuit board 36 through leads 66 and 67 at points 46 and 45, respectively. The switch 63 previously described in FIG. 2 bridges switch terminal pair 55 and 56, and an opening 68 is provided in the reflector 23' between the bulb 23 and the switch 63 to facilitate radiation transfer.

When lamp 23 is disposed in its usual position as shown in FIG. 1, a portion of the envelope of the lamp 23 is located about 2 mm. from the switch. As the lamp 23 is flashed, thermal radiations transmitted to the switch 63 and turns the switch from the "off" condition to the "on" by initiating a thermochemical reaction.

Figure 4:
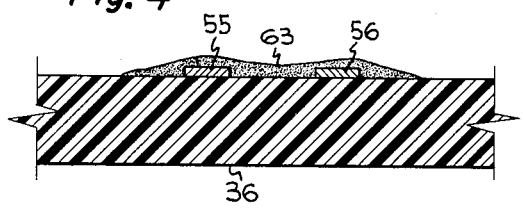
FIG. 4 is a cross sectional view through a single switch and the connecting terminals as shown in FIG. 3.

FIG. 4 shows an enlarged cross section of the switch of FIG. 3 and is typical of all radiation switches employed herein. The switch terminal pair 55 and 56 are mounted on the circuit board 36. The radiation switch 63 is applied to the circuit board 36 as a coating in electrical contact with the terminals 55 and 56. Each of the radiation switches 61, 62 and 63 upon receiving heat and/or light radiation from the adjacent lamp when it is flashed, changes from an open circuit of high resistance to a closed circuit of low resistance thereby electrically connecting the switch terminals embedded therein so as to enable flashing of the next lamp in the sequence.

The present invention is based on our discovery that a suitable material for preparing all radiation switches (e.g. 61, 62 and 63) is a carbon-containing silver salt preferably mixed with silver oxide and dispersed in a humidity resistant organic polymer binder. The carbon-containing silver salts must be relatively stable under conditions of high humidity and exhibit high electrical resistance. There is a first group of suitable carbon-containing silver salts requiring no additional powdered carbon additives and these include silver carbonate, silver pyruvate, and silver acetylacetonate. A second group of carbon-containing silver salts do require the addition of powdered carbon and these include silver acetate, silver oxalate, silver citrate, silver behenate and silver benzoate. In either group, a single carbon-containing silver salt can be used alone or different salts may be mixed together. In keeping with the invention, the salt or salts preferably are mixed with silver oxide up to about 30 percent by weight in order to provide a humidity-resistant switch which converts when exposed to the heat radiated from the lamp but which does not convert spuriously or with such vigorous action as to damage the high impact polystyrene circuit board 36.

The humidity resistant organic polymer binder provides a medium to hold the mixture together and may also be used with or without a plasticizer. The amount of binder is preferably about 5–10 weight percent based on the carbon-containing silver salt. Useful binders include the cellulose esters, such as cellulose nitrate; the cellulose ethers, such as ethyl cellulose and ethyl hydroxyethyl cellulose; acrylates such as polyalkylacrylate, polyalkylmethacrylate, polymethylmethacrylate, polymethylacrylate; polycarbonate; and polystyrene.

Also, dark colored, radiation absorbing additives which increase the amount of absorption of radiation given off by the flash lamp may be incorporated in the coating mixture. These include materials such as carbon, copper oxide, and stannous oxide. Of these, carbon additionally imparts desirable electrical properties for testing of the switches without activating them. The copper oxide and stannous oxide additives undergo conversion to the metallic state upon switch activation and thereby provide further active constituents in the switch material composition. Various inert fillers can also be incorporated in the switch material composition without significant deleterious effect upon the desired switch operation.

In applying the switches to the circuit board between the electrical terminals, conventional coating techniques may be used which require the presence of an organic diluent or solvent. Useful solvents include pine oil, hydrocarbon fluids, esters, e.g. butylacetate, etc., which are conventionally used in silk screening. The material for deposition is formed by mixing the carbon-containing silver salt, the silver oxide (if used), the organic binder and the solvent to form a slurry. This may be applied across the terminals for the switch by conventional means as a thin coating and preferably by silk screening techniques.

Our invention is further illustrated by the following examples.

EXAMPLE I

A milled powder of high purity silver carbonate ($Ag_2CO_3$) was prepared by combining a commercially available silver carbonate with toluene and grinding in a porcelain mill. The powder was filtered and air dried at room temperature. A dispersion suitable for coating was then prepared by mixing 10 grams of the silver carbonate powder with 4 grams of a binder solution consisting of 12.5 parts by weight of ethyl cellulose dissolved in 87.5 parts by weight of pine oil.

Phenolic printed circuit boards such as illustrated by FIG. 2 were prepared with tinned leads having a thickness of 1.3 mils and with spaced electrodes located 1.5 mm. apart. Thermochemical switches, elliptical in shape with a major axis of about 6 mm. and a minor axis of about 4 mm. were then screen printed between the electrodes using a 200 mesh stainless steel screen with a 3 mil emulsion backing and a Presco printer. The circuit boards were air dried 15 to 30 minutes and then dried at a temperature of 100° C. for about one hour. The thickness of the screen coating after drying was 2 to 2.5 mils.

The thermochemical switches were then evaluated by firing high voltage flashbulbs at a standard distance of about 4 mm. from the surface of the switch. The current source was a piezoelectric cell measuring 100 × 100 mils which was struck by a hammer having a force of one inch-ounce to yield a pulse of about 2 kilovolts for a duration of 5 microseconds. Originally, the resistance of the switch was determined to be about $10^{10}$ ohms or greater, and after activation, the resistance was in the range of 0.1–10 ohms. A multiplicity of these switches along with the complete circuit is shown in FIG. 2.

In order to determine the utility of this type of switch in flash arrays for commercial applications, other physical tests were performed to determine shelf life and stability to environment conditions. An important requirement is that the switches remain operative after being exposed to conditions of 95% relative humidity and a temperature of 50° C. for 14 days (336 hr.) and referred to herein as the Tropical Test. In this procedure, as sealable glass chamber partially filled with water was heated to a temperature of 50° C. A number of single switch circuit boards were placed in the chamber above the water level. The switches were exposed to moisture at 95% relative humidity, but without condensation of water on the surfaces of the switches.

During the test, the chamber was opened at intervals and the switches removed and their resistance measured. This was done in two steps: 1) the resistance was determined with an ohmmeter which applied a small D.C. voltage across the switch, and 2) the switches were exposed to a 2 kilovolts pulse generated by a piezoelectric generator. This is a very severe test causing switches, which were beginning to fail, to break down and have a lower resistance during pulsing. The pulses through the switches were observed by means of a single sweep oscilloscope. As recorded herein below, during the pulse test, up indicates that the resistance remained up at the initial value during the pulse and the switch was considered passing, whereas down indicates that the resistance fell below the initial value during the pulse and the switch was failing or showing signs of chemical reduction. The results of a series of test samples are shown in the table below:

TABLE 1

| Test | Initial | 71 Hr. | 223 Hr. | 237 Hr. | 396 Hr. |
| --- | --- | --- | --- | --- | --- |
| Resistance | ∞ | ∞ | ∞ | ∞ | ∞ |
| Pulse Test | up | up | up | up | up |

These results indicate that the switch passed the Tropical Test.

EXAMPLE II

Following the procedure of Example I, printed circuit board test panels having single switches were prepared by screen printing across a pair of spaced terminals, a mass of a composition consisting of 2 gm. $Ag_2CO_3$, 0.2 gm. ethyl cellulose and 0.05 gm powdered carbon dispersed in 1.4 gm. pine oil. The resistance of the switch initially was determined as $10^9$ ohms and after activation by flashing, the resistance was found to be 0.1–10 ohms.

The Tropical Test on a series of test samples is shown in the table below:

TABLE 2

| Test | Initial | 20 Hr. | 157 Hr. | 249 Hr. | 409 Hr. |
| --- | --- | --- | --- | --- | --- |
| Resistance | ∞ | ∞ | ∞ | ∞ | ∞ |
| Pulse Test | up | up | up | up | up |

The results indicate that the switch passed the Tropical Test.

EXAMPLE III

Following the procedure of Example I, printed circuit board test panels having single switches were prepared by screen printing across the pair of spaced terminals.

Sample IIIA was prepared from a mass of a composition consisting of 2 gm. $Ag_2CO_3$, 0.24 gm. polystrene, and 0.04 gm. powdered carbon dispersed in 1.36 gm. toluene. The initial resistance of the switch was $10^9$ ohms and after activation by flashing the resistance was found to be 0.1–10 ohms.

Sample IIIB was prepared from a mass of a composition consisting of 2 gm. $Ag_2CO_3$ and 0.24 gm. polystyrene dispersed in 1.36 gm. toluene but without the carbon additive. The initial resistance of the switch was found to be about $10^{10}$ ohms and after activation the resistance was 0.1–10 ohms. In comparing the $Ag_2CO_3$ switches with and without the presence of carbon, it was noted that both switches were activated equally well, but the switch containing carbon had a lower initial resistance.

EXAMPLE IV

Following the procedure of Example I, printed circuit test panels having single switches were prepared by silk screening a mass of a composition consisting of 2 gm. silver pyruvate and 0.2 gm. ethyl cellulose dispersed in pine oil. The resistance of the switch initially was determined as $10^{10}$ ohms and after activation by flashing the resistance was found to be 3–5 ohms.

The Tropical Test on a series of test samples is shown in the table below:

TABLE 3

| Test | Initial | 96 Hr. | 181 Hr. | 247 Hr. | 410 Hr. |
| --- | --- | --- | --- | --- | --- |
| Resistance | ∞ | ∞ | ∞ | ∞ | ∞ |
| Pulse Test | up | up | up | up | up |

The results indicate that this switch passed the Tropical Test.

EXAMPLE V

Following the procedure of Example I, printed circuit board test panels having single switches were prepared by silk screening a mass of a composition consisting of 0.325 gm. silver acetylacetonate and 0.039 gm. ethyl cellulose dispersed in 1.4 gm. pine oil. The resistance of the switch initially was determined as $10^{10}$ ohm and after activation by flashing the resistance was found to be 1–5 ohms.

EXAMPLE VI

Following the procedure of Example I, printed circuit board test panels having single switches were prepared by screen printing across a pair of spaced terminals.

Sample VI-A was prepared from a mass of a composition consisting of 0.20 gm. silver acetate, 0.72 gm. nitrocellulose and 0.06 gm powdered carbon dispersed in 1.8 gm. acetone butyl acetate mixture. The initial resistance of the switch was $10^9$ ohms and after activation by flashing the resistance was found to be 1.0–50 Kohms which is satisfactory since it is less than the resistance of the lamp.

Sample VI-B was prepared from a mass of a composition consisting of 0.20 gm. silver acetate and 0.72 gm. nitrocellulose dispersed in 1.8 gm. acetone butyl acetate mixture. The initial resistance of the switch was $10^9$ ohms and after flashing the resistance remained at $10^9$ ohms. A comparison of the switches of Sample VI-A and Sample VI-B indicates that silver acetate switches require the presence of carbon for activation by flashing according to the procedure set forth herein.

EXAMPLE VII

Following the procedure of Example VI, printed circuit board test panels having single switches were prepared by screen printing across a pair of spaced terminals.

Sample VII-A was prepared from a mass of a composition consisting of 1.35 gm. silver oxalate and 0.1 gm. ethyl cellulose dispersed in 0.7 gm. pine oil. The initial resistance of the switch was $10^{10}$ ohms and after flashing the resistance remained at $10^{10}$ ohms.

Sample VII-B was prepared from a mass of a composition consisting of 1.35 gm. silver oxalate, 0.1 gm. ethyl cellulose and 0.82 gm. SnO dispersed in pine oil. The initial resistance of the switch was $10^{10}$ ohms and after activation by flashing the resistance was 1 1ohm.

Sample VII-C was prepared from a mass of a composition consisting of 1.12 gm. silver oxalate, 0.11 gm. ethyl cellulose, and 0.03 gm. carbon dispersed in pine oil. The initial resistance of the switch was $10^{10}$ ohms and after activation by flashing the resistance was 3 ohms.

These results indicate that silver oxalate alone is not satisfactory for making the radiation switches. However, in the presence of a heat absorbing additive, such as carbon or stannous oxide, acceptable radiation switches can be prepared.

EXAMPLE VIII

Following the procedure of Example I, printed circuit board test panels having single switches were prepared by screen printing across a pair of spaced terminals. The switches were prepared from a mass of a composition consisting of 10 gm. silver oxide ($Ag_2O$) and 3 gm. of a 10% aqueous solution of polyvinyl alcohol. The initial resistance of the radiation switches was $10^{10}$ ohms and after activation by flashing the resistance was found to be 0.1–10 ohms.

The Tropical Test on a series of test samples is shown in the table below:

TABLE 4

| Test | Initial | 20 Hr. | 185 Hr. | 234 Hr. | 366 Hr. |
| --- | --- | --- | --- | --- | --- |
| Resistance | ∞ | ∞ | 3 Meg.ohm | 1,3 Kohm | 10 ohm |
| Pulse Test | up | up | down | down | down |

These results indicate that the silver oxide and hydrophilic organic polymer binder radiation switches fail to pass the Tropical Test.

Example IX

Following the procedure of Example I, printed circuit board test panels having single switches were prepared by screen printing across a pair of spaced terminals. The switches were prepared from a mass of a composition consisting of 6.25 gm. of silver oxide and 0.15 gm. of ethyl cellulose dispersed in 1.55 gm. of pine oil. The initial resistance of the radiation switches was $10^{10}$ ohms and after activation by flashing the resistance was found to be 0.1–10 ohms.

The Tropical Test on a series of test samples is shown in the table below;

TABLE 5

| Test | Initial | 94 Hr. | 185 Hr. | 234 Hr. | 366 Hr. |
| --- | --- | --- | --- | --- | --- |
| Resistance | ∞ | ∞ | 3 Meg.ohm | 1.5 Kohm | 10 ohm |
| Pulse Test | up | up | down | down | down |

These results indicate that the silver oxide and humidity resistant organic polymer binder radiation switches also fail to pass the Tropical Test.

EXAMPLE X

Following the procedure of Example I, printed circuit board test panels having single switches were prepared by screen printing across a pair of spaced terminals. The switches were prepared from a mass of a composition consisting of 4.5 gm. $Ag_2CO_3$, 0.5 gm. $Ag_2O$ and 0.15 gm. ethyl cellulose dispersed in 1.62 gm. pine oil. The initial resistance of the radiation switches was $10^{10}$ ohms and after activation by flashing the resistance was found to be 0.1–10 ohms.

The Tropical Test on a series of test samples is shown in the table below:

TABLE 6

| Test | Initial | 73 Hr. | 165 Hr. | 217 Hr. | 262 Hr. | 334 Hr. | 378 Hr. |
| --- | --- | --- | --- | --- | --- | --- | --- |
| Resistance | ∞ | ∞ | ∞ | ∞ | ∞ | ∞ | ∞ |
| Pulse Test | up | up | up | up | up | up | up |

These results indicate that a radiation switch with a silver source containing 90 parts by weight of $Ag_2CO_3$ and 10 parts by weight of $Ag_2O$ passes the Tropical Test.

It will be appreciated that the invention is not limited to the specific details shown in the examples and illustrations and that various modifications may be made within the ordinary skill in the art without departing from the spirit and scope of the invention.

What we claim as new and desire to secure by Letters Patent of the United States is:

1. A photoflash lamp unit comprising
   a. a pair of flash lamps,
   b. an electrical circuit into which said lamps are arranged to fire individually and in sequence, and
   c. a solid state, radiant energy switching device located external of the lamps and forming part of the electrical circuit, said switching device being located adjacent one of said lamps and disposed to receive radiant energy emitted by that lamp, said photoflash unit being characterized by said switching device being a high relative humidity resistant mass of a composition comprising a metallic silver source and a humidity resistant, organic polymer binder selected from the group consisting of cellulose esters, cellulose ethers, polyalkylacrylates, polyalkylmethacrylates, polymethylmethacrylate, polymethylacrylate, polystyrene and polycarbonate, said silver source consisting of at least 70% by weight of a carbon-containing silver salt and further consisting of silver oxide.

2. The unit of claim 1, wherein said carbon-containing silver salt is a member selected from the group consisting of silver carbonate, silver pyruvate, and silver acetylacetonate.

3. The unit of claim 1, wherein said silver source is a mixture of said member with up to 30% by weight of silver oxide.

4. The unit of claim 1, wherein said silver source is a member selected from the group consisting of silver acetate, silver oxalate, silver citrate, silver behenate, and silver benzoate, and the composition additionally contains up to 5% by weight of carbon powder.

5. The unit of claim 1, wherein said switching device additionally contains a radiation absorbing additive.

6. The unit of claim 5, wherein said radiation absorbing additive is a member selected from the group consisting of carbon, copper oxide and stannous oxide.

7. The unit of claim 1, wherein the switching device bridges between and contacts a pair of terminals in said electrical circuit.

8. The unit of claim 7, wherein the composition consists essentially of silver carbonate dispersed in an ethyl-cellulose binder.

9. The unit of claim 7, wherein the composition consists essentially of silver carbonate with up to 30% by weight of silver oxide dispersed in an ethylcellulose binder.

10. The unit of claim 7, wherein the composition consists essentially of silver pyruvate dispersed in an ethylcellulose binder.

11. The unit of claim 7, wherein the composition consists essentially of silver acetate and carbon dispersed in an ethylcellulose binder.

12. A radiation switching device capable of changing from a high electrical resistance to a very low electrical resistance, said device being a high relative humidity resistant mass of a composition comprising a metallic silver source and a water-insoluble organic polymer binder selected from the group consisting of cellulose esters, cellulose ethers, polyalkylacrylates, polyalkylmethacrylates, polymethylmethacrylate, polymethylacrylate, polystyrene and polycarbonate, said silver source consisting of at least 70% by weight of a carbon-containing silver salt and further consisting of silver oxide.

13. The device of claim 12, wherein said silver salt is a member selected from the group consisting of silver carbonate, silver pyruvate, and silver acetylacetonate.

14. The device of claim 12, wherein said silver salt is a member selected from the group consisting of silver acetate, silver oxalate, silver citrate, silver behenate, and silver benzoate, and the composition additionally contains radiation-absorbing carbon powder.

15. The device of claim 12, wherein said switching device additionally contains a radiation absorbing additive.

16. The device of claim 15, wherein said radiation absorbing additive is a member selected from the group consisting of carbon, copper oxide and stannous oxide.

17. The device of claim 12, wherein the switching device extends between and contacts a pair of terminals in said electrical circuit.

18. The device of claim 17, wherein the composition consists essentially of silver carbonate dispersed in an ethylcellulose binder.

19. A radiation switch for use with a photoflash unit and capable of changing from a high electrical resistance to a lower electrical resistance when exposed to radiant energy, said switch being a composition comprising a source of metallic silver and a water-insoluble organic polymer binder, said silver source comprising a mixture of
   a. at least 70% by weight of a carbon-containing silver salt and
   b. at least some and up to 30% by weight silver oxide.

20. The radiation switch of claim 19 in which said salt is silver carbonate.

21. The radiation switch of claim 19 in which said silver source is approximately 90% by weight silver carbonate and approximately 10% by weight silver oxide.

22. The radiation switch of claim 21 in which said binder is ethylcellulose.

* * * * *